US006895233B2

(12) United States Patent
Chen et al.

(10) Patent No.: US 6,895,233 B2
(45) Date of Patent: May 17, 2005

(54) VEHICLE COMPUTER SYSTEM AND ITS METHOD OF RECEIVING MESSAGE FROM CONTROL CENTER

(75) Inventors: Kuo-Rong Chen, Panchiao (TW); Chun-Chung Lee, Taipei (TW); Cheng-Hung Huang, Miaoli Hsien (TW)

(73) Assignee: Sin Etke Technology Co., Ltd., Taipei (TW)

( * ) Notice: Subject to any disclaimer, the term of this patent is extended or adjusted under 35 U.S.C. 154(b) by 529 days.

(21) Appl. No.: 10/157,922

(22) Filed: May 31, 2002

(65) Prior Publication Data

US 2004/0203731 A1 Oct. 14, 2004

(30) Foreign Application Priority Data

Mar. 27, 2002 (TW) ........................................ 91106080 A

(51) Int. Cl.[7] ................................................ H05K 11/02

(52) U.S. Cl. ................. 455/345; 455/426.1; 455/569.2; 455/575.9; 455/458; 455/99; 455/152.1

(58) Field of Search ............................. 455/345, 426.1, 455/569.2, 575.9, 96, 99, 152.1, 238.1, 297, 458

(56) References Cited

U.S. PATENT DOCUMENTS

| | | | | | |
|---|---|---|---|---|---|
| 4,821,309 | A | * | 4/1989 | Namekawa | 455/404.1 |
| 5,555,172 | A | * | 9/1996 | Potter | 455/456.1 |
| 5,990,785 | A | * | 11/1999 | Suda | 340/426.21 |
| 6,009,320 | A | * | 12/1999 | Dudley | 455/404.1 |
| 6,028,537 | A | * | 2/2000 | Suman et al. | 340/988 |
| 6,202,008 | B1 | * | 3/2001 | Beckert et al. | 701/33 |
| 6,334,061 | B1 | * | 12/2001 | Cunningham et al. | 455/553.1 |
| 6,429,768 | B1 | * | 8/2002 | Flick | 340/5.2 |
| 6,615,186 | B1 | * | 9/2003 | Kolls | 705/26 |
| 6,792,295 | B1 | * | 9/2004 | Hanevich et al. | 455/569.1 |
| 6,807,464 | B2 | * | 10/2004 | Yu et al. | 701/1 |
| 2003/0083060 | A1 | * | 5/2003 | Menendez | 455/423 |
| 2003/0134660 | A1 | * | 7/2003 | Himmel et al. | 455/557 |
| 2003/0139205 | A1 | * | 7/2003 | Belcher et al. | 455/565 |

* cited by examiner

*Primary Examiner*—David Hudspeth
*Assistant Examiner*—Huy D Nguyen
(74) *Attorney, Agent, or Firm*—Bacon & Thomas PLLC

(57) ABSTRACT

The present invention discloses a vehicle computer system, and the vehicle computer system's method of receiving messages from a control center. The vehicle computer system includes a pager and a mobile telephone. oIn order to save the communication fee between the mobile telephone and the control center, the vehicle computer system uses the pager to receive the pre-message and the mobile telephone to receive the post-message, if the message contains large amounts of data.

12 Claims, 4 Drawing Sheets

VEHICLE COMPUTER SYSTEM AND ITS METHOD OF RECEIVING MESSAGE FROM CONTROL CENTER

BACKGROUND OF THE INVENTION

1. Field of the Invention

The present invention relates to a vehicle computer system and, also relates to a method of receiving message from a control center through the vehicle computer system.

2. Description of Related Art

When the control center sends a message to the motor vehicle's computer system, the computer system uses a pager to receive the message from the control center. However, conventional vehicle computer systems are not practical for receiving large amounts or a variety of messages from the control center via broadcasting in order to save transmission fees.

Therefore, it is desirable to provide a vehicle computer system that eliminates the aforesaid drawback.

SUMMARY OF THE INVENTION

The main object of the present invention is to provide a vehicle computer system, which receives messages from the control center efficiently. The control center transmits the message via broadcasting in two steps, i.e., the message is divided into a "pre-message" and a "post-message", the control center transmits the "pre-message" and then the "post message". The "pre-message" includes information describing the characteristics of the "post-message". Therefore, the "pre-message" data amount is small. The "post-message" is the major part of the message, containing a larger data amount than the "pre-message". According to the present invention, the vehicle computer system comprises a pager and a mobile telephone. In order to improve the efficiency and save the communication fee between the vehicle computer system and the control center, the mobile telephone starts to receive the "post-message" only when the "post-message" contains a large amount of data. A "pre-message" evaluation determines whether the mobile telephone will receive the "post message". The "pre-message" evaluation directs the vehicle computer system to implement the mobile telephone to receive the "post-message".

Another object of the present invention is to allow the vehicle computer system to receive different kinds of messages from the control center, for example, system updates, advertising messages, traffic condition, map data and burglar-alarm control information messages. Note that the vehicle system can still efficiently receive broadcasted messages.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
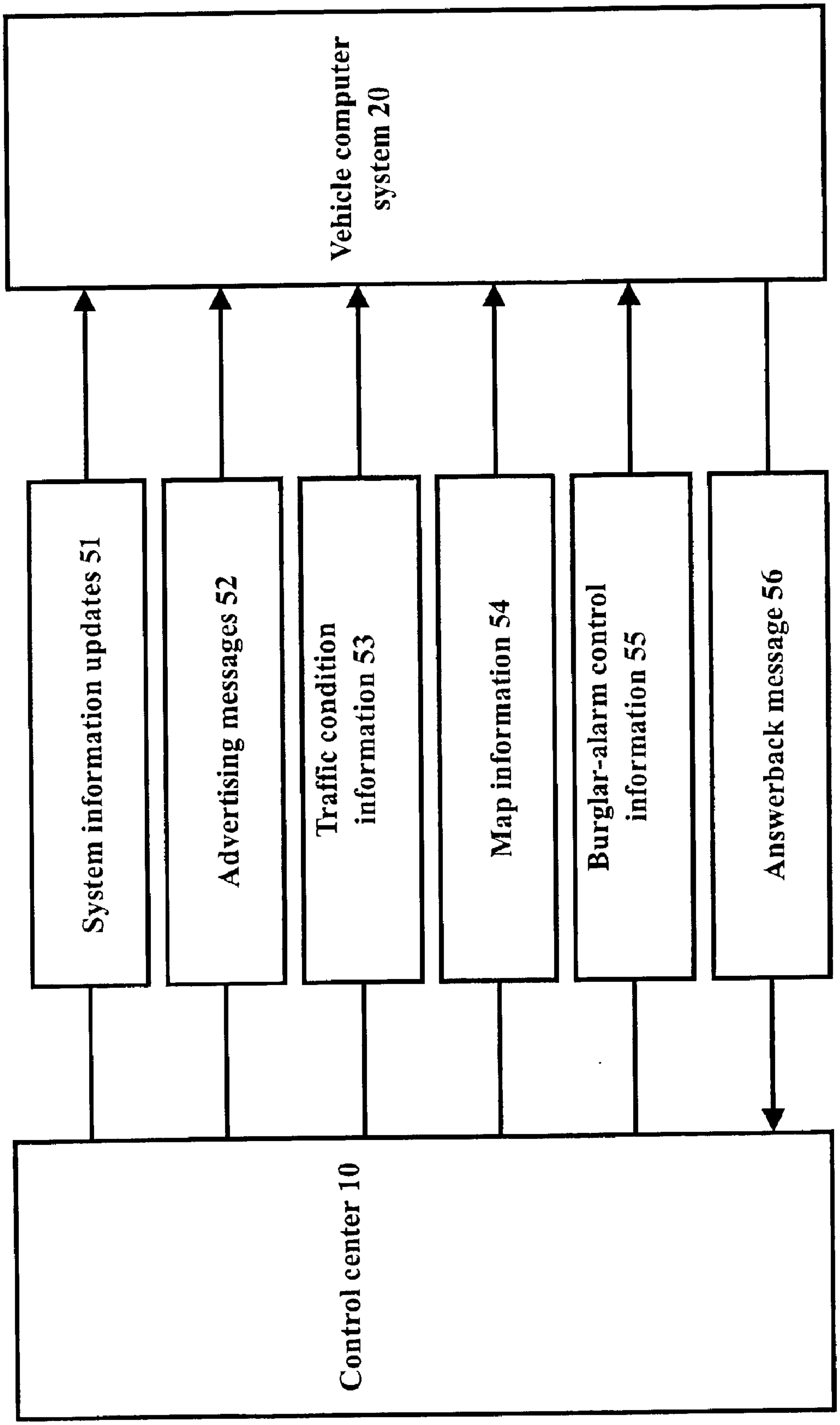
FIG. 1 is a schematic drawing explaining the use of the present invention.

Referring to FIG. 1, the control center 10 transmits messages by broadcasting, and the vehicle computer system 20 (installed in a motor vehicle), receives messages from the control center 10. The messages include for example, system information updates 51, advertising messages 52, traffic condition information 53, map information 54, and burglar-alarm control information 55. The vehicle computer system 20 can also send an answerback message 56 to the control center 10 when necessary.

Figure 2:
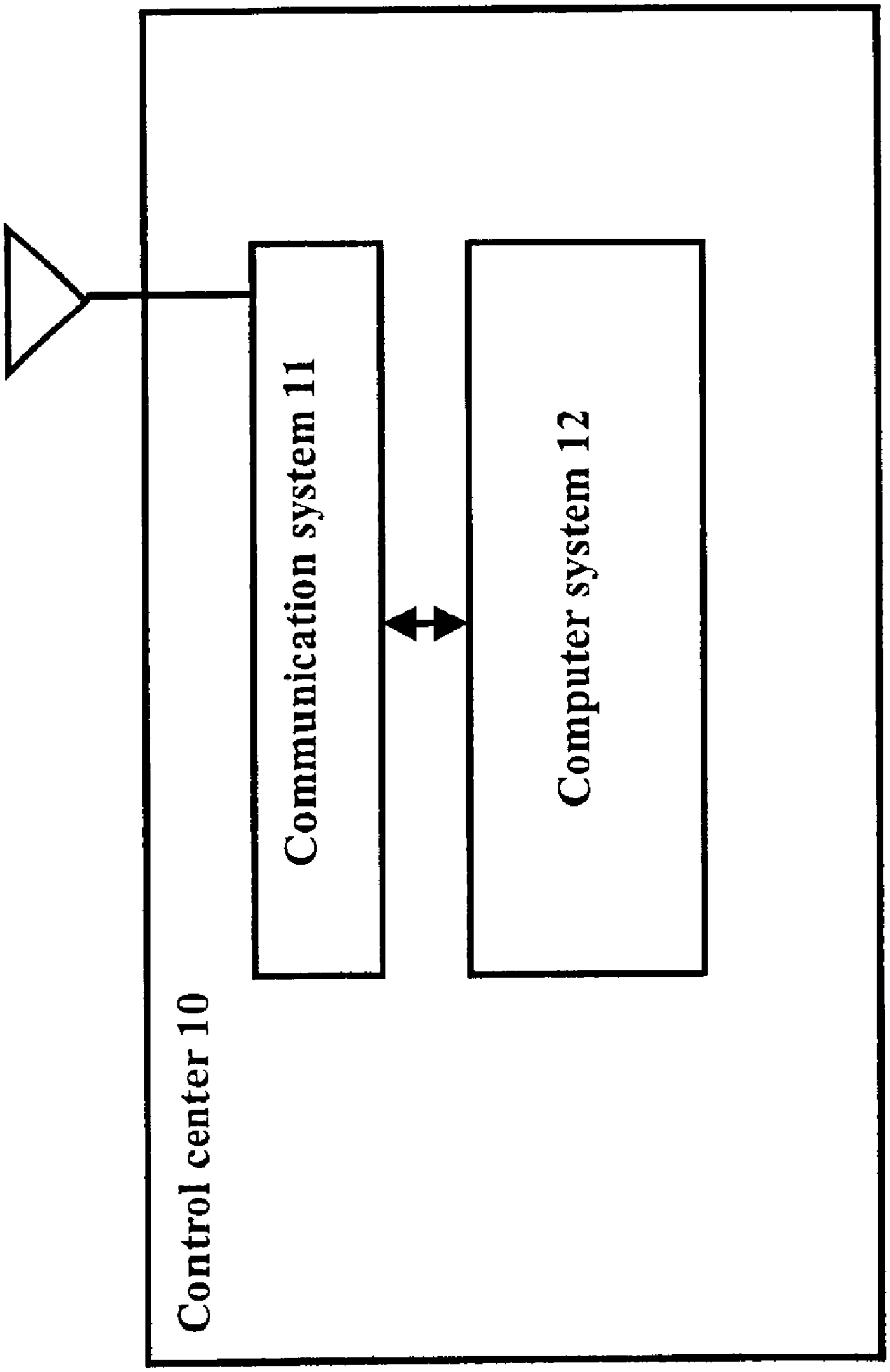
FIG. 2 is a system block diagram showing the control center's hardware architecture according to the present invention.

FIG. 2 is a system block diagram showing the control center's 10 hardware architecture. As illustrated, the control center 10 comprises a communication system 11 for receiving or transmitting messages to external targets (for example, PSTN) by a wired communication method or a wireless communication method. The communication system 11 and the computer system 12 are connected with the computer system 12 running the necessary software to transmit messages or control signals to external targets through the communication system 11.

Figure 3:
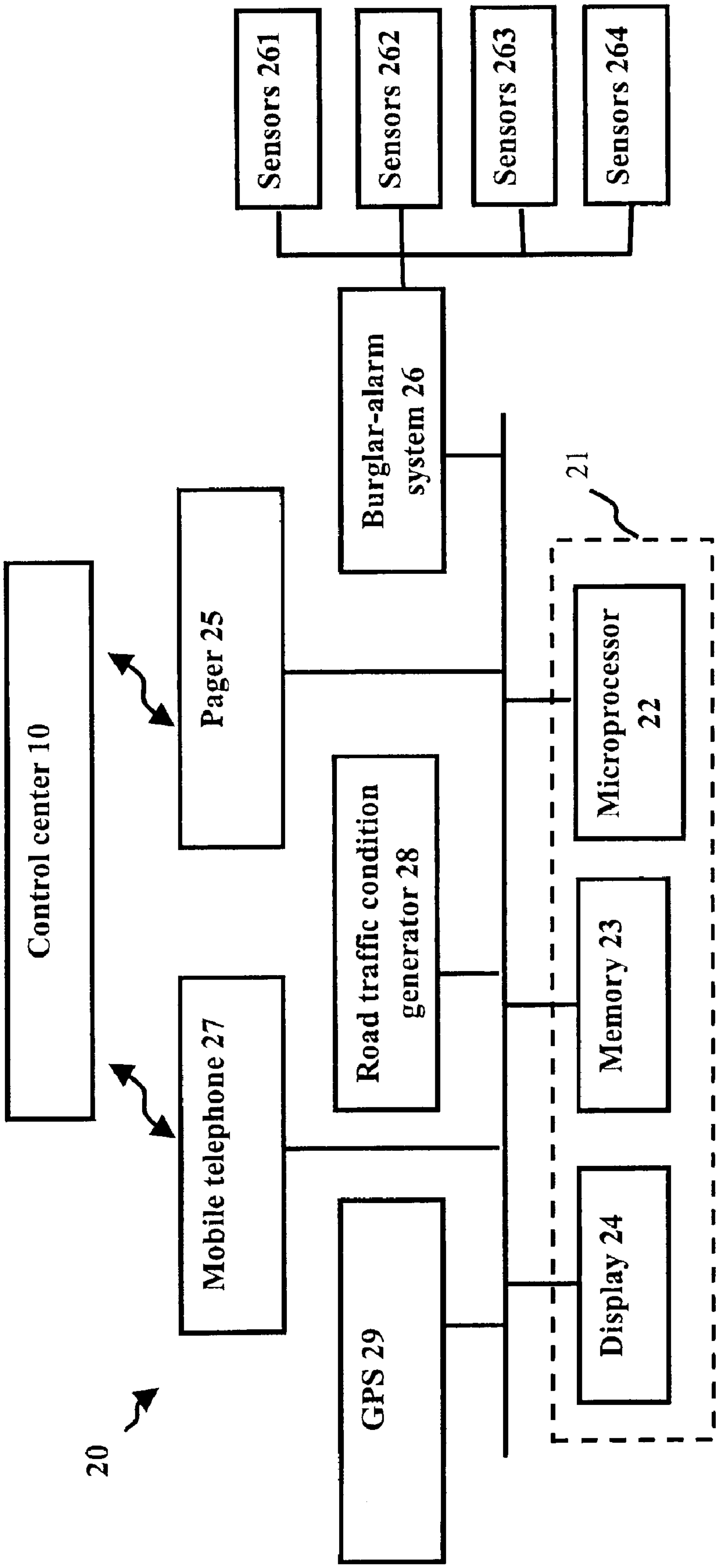
FIG. 3 is a system block diagram showing the vehicle computer system's hardware architecture according to the present invention.

FIG. 3 is a system block diagram showing the vehicle computer system's 20 hardware architecture. As illustrated, the vehicle computer system 20 comprises a host computer 21, a pager 25, a burglar-alarm system 26, a mobile telephone 27, a road traffic condition generator 28, and a GPS (global positioning system) 29. The host computer 21 comprises a microprocessor 22, a memory 23, and a display 24. The burglar-alarm system 26 has multiple sensors including burglar-alarm sensor means, vibration sensor means, etc. The sensors 261~264 are connected thereto. The aforesaid individual devices are hardware devices known to those skilled in the art. Therefore a detailed description of the devices is unnecessary.

Figure 4:
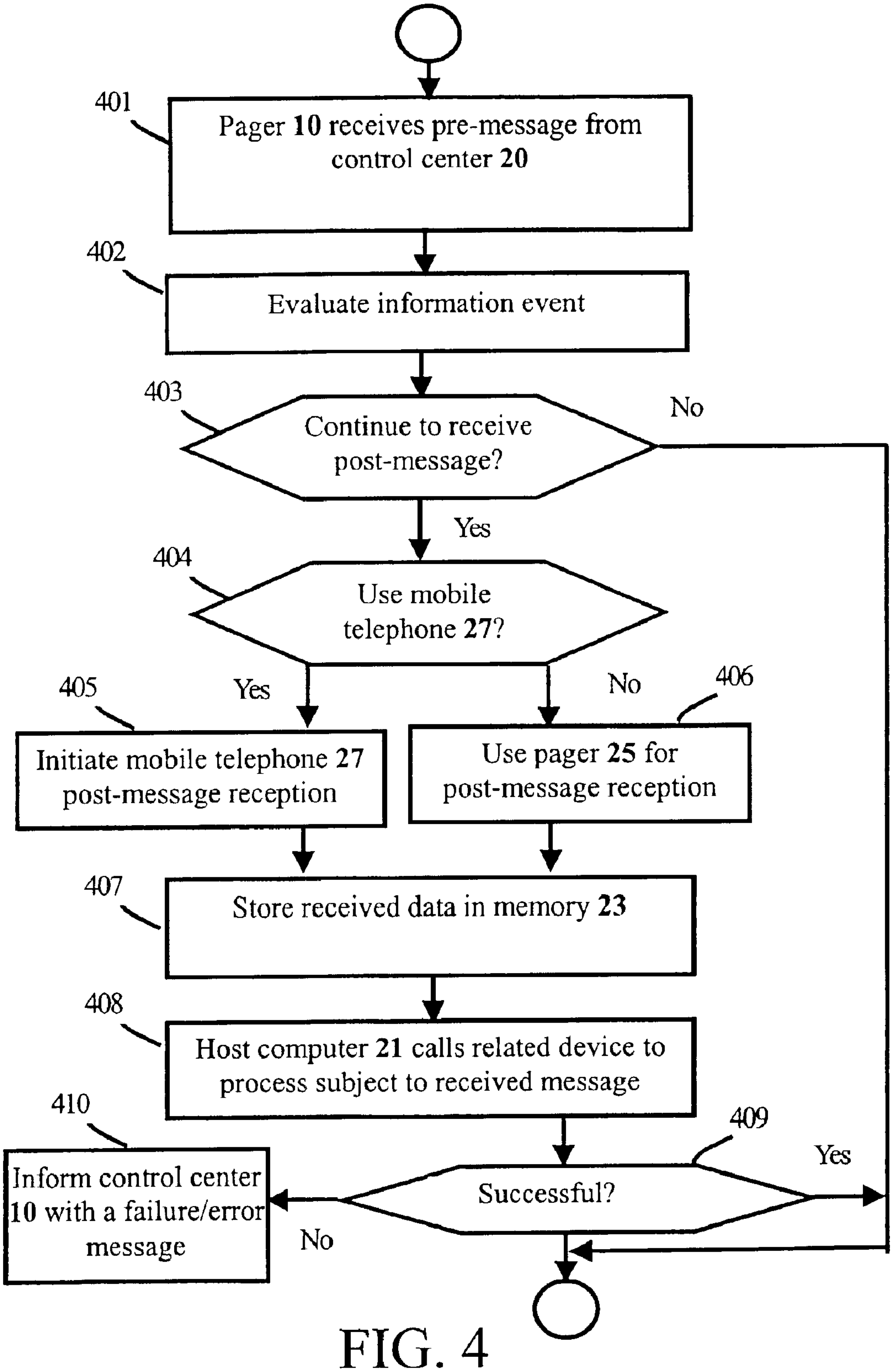
FIG. 4 is a flowchart showing the interaction between the vehicle computer system and the control center.

The interaction between the vehicle computer system 20 and the control center 10 is outlined hereinafter with reference to FIG. 4. The control center's 10 message transmitting operation characteristics are necessarily explained before describing the flowchart of FIG. 4. The control center 10 transmits messages by two steps, i.e., the message is divided into a pre-message and a post-message, with the exception of transmitting messages via broadcasting means. The pre-message contains a small amount of information including information describing the post-message. The post-message contains the message in its entirety making the post-message larger than the pre-message.

Step 401:

Direct the pager 25 to receive the pre-message from the control center 10. If the message is a system information update 51, the pre-message includes updated vehicle system model information, or updated system edition information, etc. If the message is an advertising message 52, the pre-message includes target vehicle information to which the advertising message will be delivered. If the message is traffic condition information 53, the pre-message includes the geographic location or road name. If the message is map information 54, the pre-message includes map area information. If the message is burglar-alarm control information 55, the pre-message includes the motor vehicle's serial number (for example, the mobile telephone 27 number) enabling a particular motor vehicle to receive the burglar-alarm control information 55.

Step 402:

Evaluate the message, i.e., evaluate the pre-message in order to classify the post-message.

Step 403:

Judge if to continuously receive the post-message. Proceed to Step 404 if yes. The host computer's 21 memory 23 has motor vehicle specifications stored therein, said data including "vehicle model" information, for example, vehicle computer system 20 equipment information, vehicle computer system 20 system edition, mobile telephone 27 telephone number, etc. If the message is a system information update 51, direct the host computer 21 to check the vehicle computer system 20 system edition to determine continuous post-message reception. If the message is an advertising message 52, direct the host computer 21 to verify that the motor vehicle model in which the vehicle computer system 20 is installed is in accordance with the applicable pre-message model to determine if to continuously receive the post-message. If the message is traffic condition information 53, direct the host computer 21 to verify that the road traffic condition generator 28 is included, otherwise a message will not be received. If the message is map information 54, direct the host computer 21 to verify that the GPS 29 is included, otherwise a message will not be received. If the message is burglar-alarm control information 55, direct the host computer 21 to verify that the pre-message includes the mobile telephone 27 telephone number, so as to determine continuous post-message reception.

Step 404:

Judge if to use the mobile telephone 27 to receive the post-message subject to pre-message information and then start mobile telephone 27 post-message reception if yes. Conditions for mobile telephone usage to receive post-messages include having a large data amount in the post-message. Another simple way is allowing the pre-message to inform the vehicle computer system 20 to optionally use the mobile telephone 27 to receive the post-message.

Step 405:

Direct the mobile telephone 27 to receive the post-message.

Step 406:

Direct the pager 25 to receive the post-message.

Step 407:

Store the received message (includes at least the post-message) in the memory 23.

Step 408:

Direct the host computer 21 to call the related device to process information subject to the received message. For example, direct the host computer 21 to fetch the received message from the memory 23 and to execute the instructions contained in the received message through the burglar-alarm main unit 26, the road traffic condition generator 28, or the GPS.

Step 409:

Check to ensure successful message processing, i.e., check for processing errors, for example, failed message reception during the aforesaid procedure.

Step 410:

Inform the control center 10 with a failure/error message enabling the control center 10 to control the message transmitting situations.

Although the present invention has been explained in relation to its preferred embodiment, it is to be understood that many other possible modifications and variations can be made without departing from the spirit and scope of the invention as hereinafter claimed.

What is claimed is:

1. A method of using a vehicle computer system in a motor vehicle to receive a message from a control center, said vehicle computer system comprising a host computer having a microprocessor and a memory, a pager, and a mobile telephone, said control center being adapted to transmit a pre-message and then a post-message, the method comprising the steps of:

a) directing said pager to receive said pre-message from said control center, said pre-message including information describing said post-message;

b) evaluating said pre-message to characterize said post-message;

c) judging if to continuously receive said post-message subject to the evaluation of said pre-message, and then proceeding to step d) if yes;

d) judging if to use said mobile telephone to receive said post-message subject to said pre-message information, and initiating said mobile telephone to receive said post-message if yes and under the condition of having a large data amount in said post-message, or directing said pager to receive said post-message if no; and e) storing said post-message in said memory of said host computer of said vehicle computer system.

2. The method as claimed in claim 1, wherein said post-message regards a system information update event, and said pre-message includes the vehicle system model information to be updated, so as to check if said vehicle computer system has the updated system edition or not and then to continuously receive said post-message if no during step c).

3. The method as claimed in claim 1, wherein said post-message regards an advertising message event, and said pre-message includes target vehicle information to which the advertising message is to besent, so as to verify that the motor vehicle model in which said vehicle computer system is installed is in accordance with the target vehicles and then to continuously receive said post-message if yes during step c).

4. The method as claimed in claim 1, wherein said post-message regards a traffic condition information event, so as to check if said vehicle computer system includes a road traffic condition generator or not and then not to receive said post-message if no during step c).

5. The method as claimed in claim 1, wherein said post-message regards a map information event, so as to check if said vehicle computer system includes a GPS (global positioning system) or not and then not receive said post-message if no during step c).

6. The method as claimed in claim 1, further comprising step f) sending a failure/error message to said control center through said mobile telephone when a problem is encountered during said post-message reception.

7. The vehicle computer system as claimed in claim 1, wherein said post-message regards an advertising message event, and said pre-message includes the target vehicle information to which the advertising message is to be sent, so as to verify that the motor vehicle model in which said vehicle computer system is installed is in accordance with the target vehicles and then to continuously receive said post-message if yes during step c).

8. A vehicle computer system installed in a motor vehicle and adapted for receiving a message from a control center, which transmits the message by broadcasting by means of transmitting a pre-message and then a post-message, said vehicle computer system comprising:

a host computer, said host computer comprising a microprocessor, a memory, and a display;

a pager adapted for receiving said pre-message and said post-message from said control center; and a mobile telephone adapted for receiving said pre-message and said post-message from said control center; and said host computer being adapted to achieve the steps of:

a) directing said pager to receive said pre-message from said control center, said pre-message including information describing said post-message;

b) evaluating said pre-message to characterize said post-message;

c) judging if to continuously receive said post-message subject to said pre-message evaluation, and then proceeding to step d) if yes;

d) judging if to use said mobile telephone to receive said post-message subject to said pre-message information, and then initiating said mobile telephone to receive said post-message if yes and when under the condition of having a large data amount in said post-message, or directing said pager to receive said post-message if no; and e) storing said post-message in said memory of said host computer of said vehicle computer system.

9. The vehicle computer system as claimed in claim 8, wherein said post-message regards a system information update event, and said pre-message includes the vehicle system model information to be updated, so as to check if said vehicle computer system has the updated system edition or not and then to continuously receive said post-message subject if no during step c).

10. The vehicle computer system as claimed in claim 8, further comprising a road traffic condition generator, and said post-message regards a road traffic condition information event, so that said road traffic condition generator is capable of fetching the traffic condition information post-message after step e).

11. The vehicle computer system as claimed in claim 8, further comprising a GPS (global positioning system), and said post-message regards a map information event, so that said GPS is capable of fetching the map information post-message after step e).

12. The vehicle computer system as claimed in claim 8, wherein said host computer is adapted to further achieve, after step e) the step f) sending a failure/error message to said control center through said mobile telephone when a problem is encountered during the action of receiving said post-message.

* * * * *